United States Patent
Nouri et al.

(10) Patent No.: US 10,741,398 B2
(45) Date of Patent: Aug. 11, 2020

(54) FORMATION OF RELIEFS ON THE SURFACE OF A SUBSTRATE

(71) Applicant: COMMISSARIAT A L'ENERGIE ATOMIQUE ET AUX ENERGIES ALTERNATIVES, Paris (FR)

(72) Inventors: Lamia Nouri, Le Kremelin Bicetre (FR); Stefan Landis, Tullins (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/887,311

(22) Filed: Feb. 2, 2018

(65) Prior Publication Data

US 2018/0233366 A1 Aug. 16, 2018

(30) Foreign Application Priority Data

Feb. 2, 2017 (FR) ..................... 17 50864

(51) Int. Cl.
*H01L 21/00* (2006.01)
*H01L 21/266* (2006.01)
(Continued)

(52) U.S. Cl.
CPC ........ *H01L 21/266* (2013.01); *B81C 1/00031* (2013.01); *H01L 21/26506* (2013.01);
(Continued)

(58) Field of Classification Search
CPC ............. H01L 21/266; H01L 21/26506; H01L 21/30608; H01L 21/3065
See application file for complete search history.

(56) References Cited

U.S. PATENT DOCUMENTS 4,021,276 A * 5/1977 Cho ...................... H01L 21/266
  216/2
5,744,293 A * 4/1998 Okumura ................ G03F 7/091
  430/271.1
(Continued)

FOREIGN PATENT DOCUMENTS

WO 2016/145337 9/2016

OTHER PUBLICATIONS

WO2016145337: Specification and Drawings, in separate documents. Part of Applicant's IDS. Included here, since the copy submitted by Applicant is not searchable and of low graphic quality. (Year: 2016).*

(Continued)

*Primary Examiner* — Kimberly N Rizkallah
*Assistant Examiner* — Alexander Belousov
(74) *Attorney, Agent, or Firm* — Oblon, McClelland, Maier & Neustadt, L.L.P.

(57) ABSTRACT

A method for forming reliefs on a face of a substrate is provided, successively including forming a protective screen for protecting at least a first zone of the face; an implanting to introduce at least one species comprising carbon into the substrate from the face of the substrate, the forming of the protective screen and the implanting being configured to form, in the substrate, at least one carbon modified layer having a concentration of implanted carbon greater than or equal to an etching threshold only from a second zone of the face of the substrate not protected by the protective screen; removing the protective screen; and etching the substrate from the first zone selectively with respect to the second zone.

18 Claims, 5 Drawing Sheets

Détail B

Détail B (51) Int. Cl.
  *H01L 31/18* (2006.01)
  *H01L 21/265* (2006.01)
  *H01L 21/308* (2006.01)
  *B81C 1/00* (2006.01)
  *H01L 21/306* (2006.01)
  *H01L 21/3065* (2006.01)
  *H01L 33/00* (2010.01)

(52) U.S. Cl.
  CPC .... *H01L 21/26526* (2013.01); *H01L 21/3065* (2013.01); *H01L 21/3086* (2013.01); *H01L 21/30608* (2013.01); *H01L 31/18* (2013.01); *B81B 2207/056* (2013.01); *H01L 33/0079* (2013.01)

(56) References Cited

U.S. PATENT DOCUMENTS

| | | |
|---|---|---|
| 2014/0206195 A1 | 7/2014 | Lauerhaas |
| 2015/0380599 A1 | 12/2015 | Smith et al. |
| 2016/0133767 A1 | 5/2016 | Smith et al. |

OTHER PUBLICATIONS

French Preliminary Search Report dated Sep. 26, 2017 in French Application 17 50864 filed on Feb. 2, 2017 (with English Translation of Categories of Cited Documents and Written Opinion).

H. Seidel, et al., "Anisotropic Etching of Crystalline Silicon in Alkaline Solutions," J. Electrochem. Soc., vol. 137 No. 11, Nov. 1990, pp. 3612-3626.

P. Normand, et al., "A new masking method for protecting silicon surfaces during anisotropic silicon wet etching," Microelectronic Engineering vols. 61-62, Jul. 2002, pp. 895-900.

Yan Wang, et al., "Maskless inverted pyramid texturization of silicon," Scientific Reports 5, Article No. 10843, 2015, 6 Pages.

Yujie Fan, et al., "Differences in etching characteristics of TMAH and KOH on preparing inverted pyramids for silicon solar cells," Applied Surface Science vol. 264, 2013, pp. 761-766.

Jae Sung You, et al., "Experiments on anisotropic etching of Si in TMAH," Solar Energy Materials & Solar Cells, vol. 66, Issues 1-4, 2001, pp. 37-44.

* cited by examiner

Détail A   FIG. 1b

Détail B   FIG. 2b

Détail A   FIG. 1c

Détail B   FIG. 2c

Détail A   FIG. 1d

Détail B   FIG. 2d

Détail A   FIG. 1e

Détail B   FIG. 2e

Détail A   FIG. 1f

Détail B   FIG. 2f

Détail A   FIG. 1g

FORMATION OF RELIEFS ON THE SURFACE OF A SUBSTRATE

FIELD OF THE INVENTION

The present invention relates to a method for structuring the surface of a substrate and more generally a method for creating patterns on the surface of a substrate.

The invention has an advantageous but non-limiting use in the manufacturing of microelectronic devices. Microelectronic device means any type of device made with means from the microelectronics industry. These devices cover in particular, in addition to purely electronic devices, micromechanical or electromechanical devices (MEMS, NEMS . . . ) and optical and optoelectronic devices (MO-EMS . . . ).

A particularly advantageous but non-limiting field of use relates to the manufacturing of photovoltaic cells.

TECHNOLOGICAL BACKGROUND

The possibility of obtaining wafers and substrates, having a structured surface ("patterned substrate") that is to say the surface of which is at least partly covered by patterns in relief, can be very advantageous. In particular, this is the case for photovoltaic cells and most optical or optoelectronic devices, namely light-emitting diodes (LEDs) in which the efficiency of conversion of an electric current into light is highly dependent on the surface state of the substrate from which they are manufactured.

The existing methods for structuring substrates comprise numerous steps, a synthetic review of which is reproduced in FIGS. 1a to 1f.

Figure 1A:
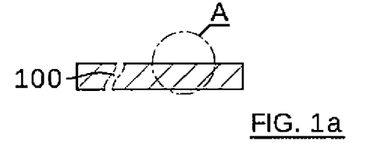
FIGS. 1a to 1g successively show steps implemented according to the prior art in order to create reliefs via etching in a substrate, with creation of a hard mask.
Figure 1B:
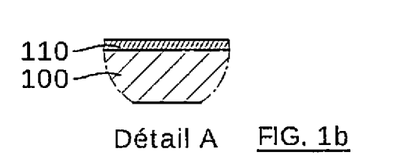

FIG. 1a illustrates a substrate 100 on which the patterns are to be created. On this basis, the current conventional technique proposes the creation of a layer of hard mask 110 generally made of nitride of silicon of oxide or of silicon. This layer 110 is deposited on a face of the substrate 100, as illustrated in FIG. 1b. One or more patterns 130 are then defined in the layer 110 in such a way as to selectively expose certain portions of the face of the substrate 100 while protecting other portions with the hard mask.

Figure 1C:
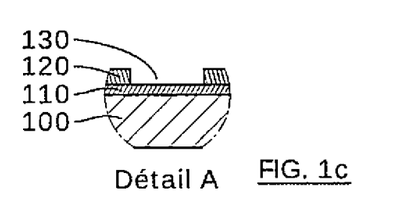

In order to define these patterns 130, as illustrated in FIG. 1c, conventionally the deposition of a layer for defining patterns 120, made of resin, and then the opening of the resin by one of the conventional photolithography techniques are planned.

Figure 1D:
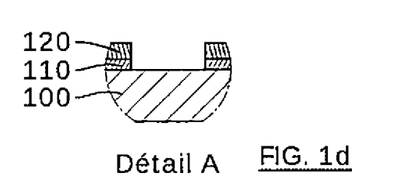
Figure 1E:
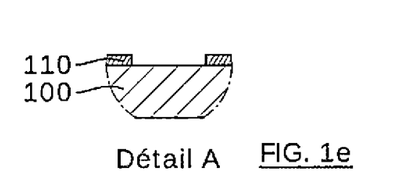

FIG. 1d and FIG. 1e show, respectively, the opening of the hard mask and the elimination of the layer of resin 120.

At this stage, the substrate 100 can be attacked from its front face via etching in order to define the desired relief.

Figure 1F:
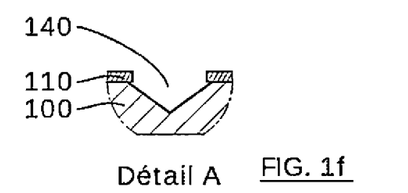
Figure 1G:
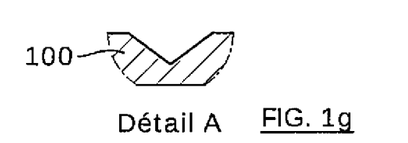

The illustration given in FIG. 1f is an example of a relief 140 in the shape of an inverted pyramid that can be for example implemented via wet etching using a basic solution (for example containing potassium hydroxide for a material of substrate to be etched such as silicon). Dry etching is also possible but has the disadvantage of being costlier. At the end of etching, the hard mask can be eliminated in order to arrive at the result of FIG. 1g.

From the figures described above, it is understood that a large number of steps is necessarily comprised in the current techniques that use hard masks. These current techniques thus lead to a method time and a cost that it would be advantageous to reduce.

The goal of the present invention is in particular to at least partly reduce the disadvantages of the current techniques.

SUMMARY OF THE INVENTION

One non-limiting aspect of the invention relates to a method for forming reliefs on the surface of a substrate.

Advantageously, the method comprises at least the following steps:

A formation of a protective screen for protecting at least a first zone of the face;

A implantation configured to introduce at least one species comprising carbon into the substrate from said face, the formation of a screen and the implantation being configured to form, in the substrate, at least one carbon modified layer having a concentration of implanted carbon greater than or equal to an etching threshold only from a second zone of said face not protected by the protective screen;

preferably, removal of the protective screen with respect to the substrate;

etching of the substrate from the first zone selectively with respect to the second zone.

After the etching, the method allows reliefs to be formed.

Surprisingly, the invention revealed that it was possible to use the chemical species carbon as a base for forming a modified portion of the material of the substrate intended to be etched, in order to make this modified portion resistant to etching. The modification via implantation of carbon applied to the substrate avoids the use of deposition of a hard mask. Thus, it is not necessary to form a layer of hard mask via deposition or carry out the multiple steps of lithography necessary for opening such a mask in order to define the zones of the substrate that will be subjected to the etching. The invention also allows the step of removing the hard mask to be eliminated.

Potentially, the number of steps implemented by the invention can thus be considerably less than in the conventional techniques based on the deposition of a hard mask.

According to a preferred embodiment, the formation of the protective screen comprises the deposition of a layer for defining patterns on said face, and then the formation, using the layer for defining patterns, of at least one pattern in the first zone.

Moreover, the layer for defining patterns preferably comprises at least one carbon species and the implantation comprises the use of an ion beam carried out in such a way as:

to remove, from the layer for defining patterns, at least a portion of the carbon species such as at least carbon ions of the carbon species and to make a portion of the carbon species such as at least carbon ions penetrate into the substrate from the second zone.

The implantation of carbon ions or of carbon species can thus be at least partially indirect.

Advantageously, this implantation can be carried out through a deposition of a layer for defining patterns carried out for example via nanoimprinting. It is thus not necessary to remove the residual thickness at the bottom of the hollow patterns, which reduces the total number of steps in the method. Moreover, nanoimprinting techniques are in general less costly than the lithography techniques that require the design of lithography masks.

Moreover, the ion beam does not necessarily contain carbon species. It can in particular not contain any carbon species. It can for example contain heavy ions, which increases the compatibility of the method with existing methods routinely used in the microelectronics industry.

Finally, this embodiment does not require a contact mask or a projection mask, which are in general costly and not very versatile.

Advantageously, the layer for defining patterns simultaneously carries out the functions of mask and of source of carbon species.

According to another aspect, the present invention relates to a device obtained by the method.

BRIEF INTRODUCTION OF THE FIGURES

Other features, goals and advantages of the present invention will be clear upon reading the detailed description that follows, in comparison to the appended drawings, which are given as examples, are non-limiting, and in which:

FIG. 7 is a microscope view corresponding to the step of FIG. 6a and

The drawings are given as examples and are not limiting to the invention. They are schematic representations of a principle intended to facilitate the understanding of the invention and are not necessarily on the scale of the practical applications. In particular, the relative thicknesses of the substrate, the mask, the carbon modified layer, the layers of resin and the patterns are not representative of reality.

DETAILED DESCRIPTION

Before starting a detailed review of embodiments of the invention, optional features that can optionally be used in any combination or alternatively are listed below:

According to one embodiment, the species comprising carbon is carbon ions and/or at least one chemical compound comprising carbon.

According to one embodiment, the substrate is made of silicon. Preferably, it is chosen from: monocrystalline silicon, multicrystalline silicon, amorphous silicon.

According to one embodiment, the implantation is configured in such a way that the modified layer has a thickness greater than or equal to 5 nm.

According to one embodiment, the implantation is configured in such a way that the modified layer contains a concentration of implanted carbon of at least $10^{17}$ and preferably of at least $10^{18}$ atoms of carbon per $cm^3$.

According to one embodiment, the formation of the screen and the implantation are configured to not produce any implantation in the first zone.

According to one embodiment, the method comprises a removal of the modified layer after the etching.

According to one embodiment, the removal comprises plasma etching.

According to an alternative embodiment, the etching comprises at least one step of wet etching. According to one embodiment, the step of wet etching is configured to etch a region of the substrate located under the modified layer. According to one embodiment, the region of the substrate is located under and in contact with the entirety of the modified layer.

According to one embodiment, at least one portion of the second zone forms a closed contour around at least one portion of the first zone.

According to one embodiment, the formation of a screen comprises the placement of a mask above and preferably at a distance from the face, the mask being open only opposite the second zone (201) in a direction of implantation.

According to one embodiment, the formation of a screen comprises deposition of a layer for defining patterns on the face, and then the formation, from the layer for defining patterns, of at least one pattern on the first zone.

According to one embodiment, the formation of at least one pattern comprises elimination of the entire thickness of the layer for defining patterns in the second zone.

Alternatively, the formation of at least one pattern comprises elimination of only a portion of the thickness of the layer for defining patterns in the second zone, the elimination comprising a step of nanoimprinting or a step of lithography.

According to one embodiment, the layer for defining patterns comprises at least one antireflective undercoat (BARC). This antireflective undercoat can comprise carbon species. The layer for defining patterns preferably also comprises at least one layer of resin above the antireflective undercoat.

According to one embodiment, the layer for defining patterns comprises at least one carbon species and the implantation comprises a use of an ion beam carried out in such a way as:

to remove, from the layer for defining patterns, at least carbon ions of the carbon species, and to make carbon ions from the carbon species penetrate into the substrate from the second zone.

This implantation can thus be qualified as "indirect implantation" since the carbon species, for example the carbon ions, implanted in the substrate do not come from the beam but from the layer for defining patterns. According to one embodiment, the implantation of the carbon species in the substrate is only indirect. This means that the incident beam on the layer for defining patterns does not comprise carbon ions or carbon species. According to one example of embodiment, the layer for defining patterns comprises at least one undercoat, for example antireflective, and preferably at least one upper layer, for example of resin, above the undercoat. The formation of the pattern can involve removing, vertically in line with the second zone, the layer above the undercoat.

Alternatively, the implantation is an implantation of carbon ions and/or of at least one chemical compound comprising carbon. This implantation can thus be qualified as "indirect implantation" since the carbon species implanted in the substrate come from the beam incident to the substrate.

According to another example of an embodiment of the invention, the two preceding embodiments are combined. Thus, the carbon species implanted in the substrate come from both the beam of ions incident to the substrate and the at least one carbon species present in the layer for defining patterns. This embodiment allows the modified layer to be formed via direct and indirect (removal then penetration) implantation in such a way as to reinforce the concentration of carbon implanted in the modified layer.

According to one embodiment, the ion beam is a beam of non-carbon ions, and preferably a beam of heavy ions.

According to one embodiment, the formation of at least one pattern involves elimination of the entire thickness of the layer for defining patterns in the second zone.

Preferably, the parameters of the implantation, in particular inclination, that is to say, the main angle of incidence, of the ion beam with respect to the substrate (that is to say, to the main plane in which the substrate or said face extends), are chosen in such a way that the carbon ions that penetrate into the substrate are removed from sides of the pattern of the layer for defining patterns. Typically, these sides extend vertically to the main plane in which the substrate or said face extends.

It is specified that in the context of the present invention, the terms "on", "above", "covers", "underlying" and their equivalents do not necessarily mean "in contact with." Thus, for example, the transfer, gluing, assembly, applying or deposition of a first layer onto a second layer, does not necessarily mean that the two layers are directly in contact with one another, but means that the first layer at least partially covers the second layer while being either directly in contact with it or being separated from it by at least one other layer or at least one other element.

Moreover, a layer can be composed of a plurality of undercoats of the same material or of different materials.

It is specified that in the context of the present invention, the thickness of a layer or of the substrate is measured in a direction perpendicular to the surface along which this layer or this substrate has its maximum extension.

The use of the singular for certain elements of the invention does not necessarily mean that a given element is present only once in the invention. The word "one" does not therefore exclusively means "a single", unless otherwise specified.

The method according to the invention can be particularly advantageous for manufacturing diffraction gratings or absorption gratings, for example for the LED or photovoltaic market.

Figure 2A:
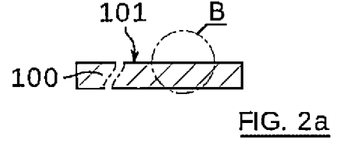
FIGS. 2a to 2f illustrate, as a counterpoint to FIGS. 1a to 1g, a non-limiting embodiment of the invention in a plurality of successive steps.

FIG. 2a shows, as the starting point of the method of the invention, a substrate 100 that can be equivalent to the conventional substrate mentioned in the technological background section of the present description. The invention allows reliefs to be created using a face 101 of this substrate.

The substrate 100 can be self-supporting or not. It can rest or not rest on one or more other layers. The substrate 100 can be monocrystalline, polycrystalline or amorphous according to the uses in question. The substrate is typically made from a material comprising at least one of the following materials: silicon (Si), sapphire silicon-germanium (SiGe), SiN and quartz. For example, the substrate 100 can be made of silicon (Si), silicon-germanium (SiGe) preferably monocrystalline or polycrystalline. The substrate 100 can also be made of quartz or of sapphire.

Figure 2B:
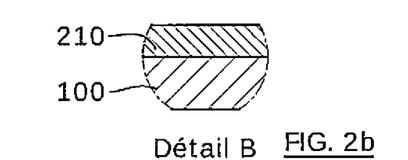

FIG. 2b is a detailed view of FIG. 2a and moreover shows that a layer 210 has been formed on the face 101. This layer 210 is advantageously made of resin and is intended to be used to define patterns allowing a first zone of the substrate to be differentiated from a second zone. In the context of the present invention, resin means an organic or organo-mineral material that can be shaped by being exposed to a beam of electrons, of photons or of X-rays or mechanically.

The images in FIGS. 2b to 2f concentrate on a detail B of FIG. 2a and thus on a limited region of the substrate 100. Of course, the example provided in these images can be extended to a greater portion of the substrate 100, in particular in order to form a plurality of protective patterns 220 described below and a plurality of reliefs.

Figure 2C:
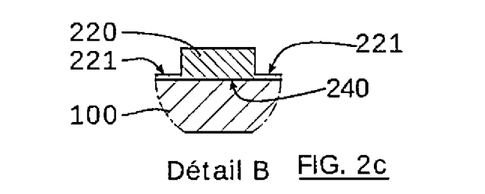

Indeed, FIG. 2c shows a shaping of the layer 210 in a mechanical manner, for example via nanoimprinting. Thus, a protective pattern 220 that advantageously has the same thickness as the initial thickness of the layer 210 is defined. The protective pattern 220 covers a first zone, labelled with the reference 240 in FIG. 2e, of the face 101 of the substrate 100.

Figure 2D:
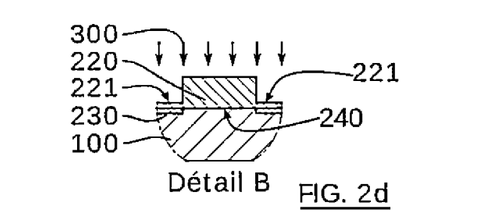

A second zone 221 of the face 101 of the substrate 100 is covered with a thickness smaller than the thickness of the original layer 210, as illustrated by the embodiment in FIG. 2d. This is in particular the case when the protective pattern 220 is formed via nanoimprinting, this type of technique leaving in place a residual thickness at the bottom of the hollow patterns.

The case of a residual portion of the layer 210 in the second zone 221 can also be produced by using a layer 210 comprising, besides a first layer of resin strictly speaking, an undercoat underlying the first and having a functionality of fighting optical reflection during the phase of insulating the resin. These materials can be of the type known by the acronym BARC (which means: bottom anti-reflective coating). In this case, it is possible to leave the antireflective coating in the second zone 221.

According to one embodiment (illustrated in FIG. 3a, which will be described in detail below), the thickness of the original layer 210 is zero vertically in line with the second zone 221. In this case, the material of the layer 210 is totally eliminated in the second zone 221.

At this stage, a screen having a degree of protection greater in the first zone 240 than in the second zone 221 is thus created by the presence of the protective pattern 220. Here, the terms "first zone" and "second zone" mean two distinct portions of the substrate 100 accessible from the face 101. The configuration of these zones is not limited by the invention. For example, the second zone 221 can be organised in a grid as will be shown by later examples, and the first zone 240 can be organised into a plurality of discontinuous portions of the substrate 100.

A phase of implantation 300 shown in FIG. 2d is then carried out from the face 101. This implantation impacts the substrate differently according to whether it is directed towards the first zone 240 covered with a protective pattern 220 or towards the second zone 221 that is no longer covered with resin or slightly covered. The formation of the patterns 220 thus ensures selectivity of implantation. The goal of the implantation is to modify the material of the substrate 100 from the face 101 in order to produce a carbon modified layer 230, the properties of which are sufficiently different from those of the material of the substrate 100 to then carry out selective etching of the latter material with respect to the material of the modified layer.

Advantageously, the thickness of the modified layer 230 from the face 101 is greater than or equal to 5 nm and advantageously greater than or equal to 20 nm. The implantation concentration corresponding to the density of atoms of carbon per unit of volume in the modified layer 230 is preferably greater than or equal to $10^{18}$ atoms per $cm^3$.

According to a first embodiment, the implantation is carried out by beams of carbon ions. For example, an ion implanter can be used to implant carbon ions at 5 kev and a dose per surface unit of $10^{16}$ atoms of carbon per $cm^2$. For a substrate made of silicon, this allows a thickness of modified layer of 30 nm to be produced if there is no longer a layer 210 above the second zone 221. According to this possibility, the ion beam incident to the layer 210 carrying the patterns 220 comprises only carbon ions or carbon ions and other species.

According to another possibility, the implantation is carried out by projection of more complex ion beams comprising at least one species comprising carbon. This latter technique can be implemented via plasma immersion or in an etching reactor in which case the elements of the carbon gas of the plasma that is used are implanted. The latter technique can be used to carry out implantation over a smaller depth in the substrate 100.

According to another possibility, the implantation can be indirect. This means that the implantation is carried out with a beam of non-carbon ions, for example with heavy ions, such as argon, in order to remove, from the layer for defining patterns 210, carbon species, typically atoms of carbons. At least a portion of these carbon species extracted from the layer for defining patterns 210, then penetrate, the second zone 221 of the substrate 100. In this second zone 221, the material of the substrate is thus enriched with carbon. This contamination of the substrate can be obtained with or without residual thickness of the layer for defining patterns 210 in the second zone 221. According to one embodiment, the beam incident to the layer 210 does not contain carbon species. This embodiment with indirect implantation allows the disadvantages related to the use of carbon, in particular on the equipment used during the implantation, to be avoided.

Naturally, if this residual thickness is present, its thickness must be sufficiently small to allow the heavy ions implanted to move the carbon atoms into the substrate 100. In any case, if the layer for defining patterns 210 comprises carbon species, which is the case if it is a layer of resin, then these carbon species can be moved into the substrate 100 by the heavy ions implanted. "Heavy" ions are ions, the mass of which is greater than or equal to that of oxygen (O2) and preferably greater than or equal to that of argon (Ar)

If the second zone 221 of the substrate 100 is not covered by a residual thickness of layer for defining patterns 210, the atoms of carbon are removed from the sides and the tops of the patterns 220.

If a technique of forming patterns that implements an antireflective undercoat as previously described (for example BARC) is used, this undercoat can remain in the second zone 221 and the contamination with carbon can be produced using the carbon species of this material. Thus, in this case, the layer 210 for forming the patterns comprises a stack of layers, the stack comprising at least one undercoat for example such as a barrier layer and/or such as a BARC, above which there is at least one upper layer, for example made of resin. The formation of the patterns can involve eliminating the upper layer and preserving the undercoat. The implantation is then carried out through the undercoat.

Naturally, it is possible to combine the two embodiments described above. Thus, the carbon implanted in the substrate can come simultaneously from direct implantation and from indirect implantation. Typically, the layer 210 covers the second zone and contains carbon species. The ion beam arriving on the layer 210 contains carbon and optionally other species such as heavy ions. This beam partially passes through at least the layer 210 vertically in line with the second zone in order to bring the carbon ions that it contains into the substrate 100 (direct implantation). Moreover, the beam removes carbon species, for example carbon ions, in the carbon layer 210 and makes these species penetrate into the substrate 100 (indirect implantation).

This embodiment allows the modified layer 230 to be enriched with carbon even more easily.

The implantation 300 is preferably directed along the thickness dimension of the substrate 100.

The implantation conditions are adjusted in order for only the second zone 221 receiving a dose of carbon ions to exceed a threshold beyond which the material of the substrate is sufficiently modified to become clearly more sensitive to etching than the material not modified or modified with a dose below the threshold. Thus, according to a first possibility, the material of the substrate 100 is absolutely not modified (no implantation of carbon carried out) in the first zone 240. According to a second possibility, the material of the substrate 100 can undergo, in this possibility, implantation in order to form a layer having a modification, but this modification is configured to not exceed the predefined threshold. For example, this modification in the first zone 240 remains less than this threshold by at least 20% and preferably by at least 50%.

Figure 2E:
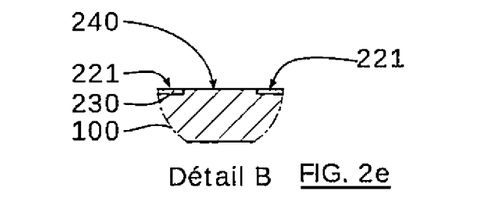
Figure 2F:
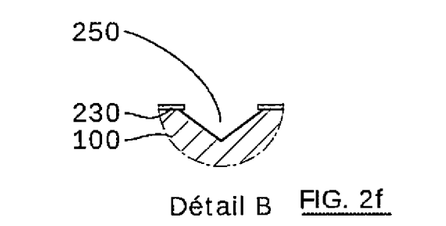

After the implantation step, the residual portion of the layer for defining patterns 210, that is to say, at least the patterns 220, is removed, for example via a conventional technique of lift-off. At this stage, the substrate comprises portions provided with the modified layer 230 and portions for which the original material of the substrate 100 remains exposed at the face 101, as shown in FIG. 2e.

Etching is then carried out in order to produce the desired hollow reliefs from the face 101 towards the inside of the substrate 100 in the first zone 240. This etching can be carried out via a wet process, for example with basic solutions such as potassium hydroxide (KOH), sodium hydroxide (NaOH) or tetramethylammonium hydroxide (TMAH); the addition of a surfactant and/or of alcohol is also possible. The wet etching can be carried out when hot or when cold, according to the desired etching rate. The anisotropy of the basic wet etching can allow a region of the substrate 100 located below the modified layer 230 to be etched as visible in FIG. 2f and more specifically in FIG. 5b at the reference 253.

According to another embodiment, dry etching is carried out, typically using the technique of reactive-ion etching known by the acronym RIE.

Figure 9:
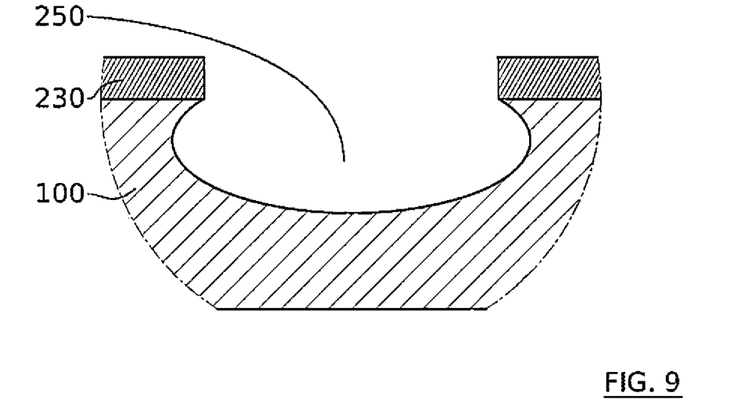
FIG. 9 illustrates a relief in the shape of an inverted ellipsoid obtained according to an embodiment of the invention.

It is also possible to carry out isotropic wet etching, for example using an acidic solution in particular containing HF such as Hf+HNO3 or Hf+H2O2. In this case, instead of inverted pyramids, structures in the shape of a "ball", sphere or inverted ellipsoid are obtained. This "ball" extends laterally under the carbon layer if the etching time is increased. FIG. 9 illustrates this type of structure.

It should be noted that for numerous uses, the modified layer 230 can be kept at the end of the method. This is the case for the uses in which obtaining geometric or mechanical properties of the substrate is substantially sought, as is the case for photovoltaic cells.

According to another embodiment, the modified layer 230 can be removed. It is then possible to eliminate the carbon layer 230 selectively with respect to the non-modified portions of the substrate 100.

For this, this carbon layer can be removed by using an oxidising plasma containing dioxygen or an $O_2/N_2$, $O_2/Ar$ mixture or a reducing plasma containing $H_2$, $H_2/N_2$ or $H_2/Ar$, in the example of a substrate 100 of silicon, the layer 230 of which is carbon silicon. According to another example, if the layer is silicon that incorporates graphite, a plasma containing $CF_4$ can be used to remove it.

According to yet another embodiment that is dependent on the geometry of the modified layer 230 and on the etching of the substrate 100, it is possible to eliminate the modified layer 230 automatically without having to use an additional step. This is the case when the etching is anisotropic and removes a portion of the substrate 100 located under the modified layer 230 until reaching the etching formed at an adjacent hollow relief. The modified layer 230 located between these two adjacent reliefs is thus no longer supported and is automatically removed. This case is described in more detail in reference to FIGS. 3d and 5b FIGS. 3a to 3d show, in a more general manner, an embodiment of the invention for forming a plurality of reliefs according to a predetermined pattern on the surface of the substrate 100.

Figure 3A:
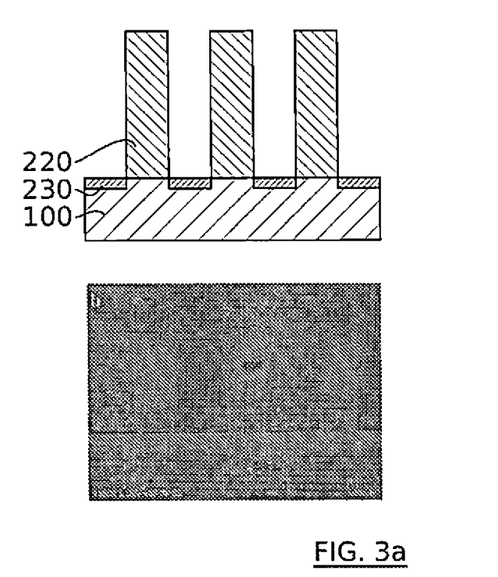
FIGS. 3a to 3d show another embodiment of the invention with successive steps.
Figure 3B:
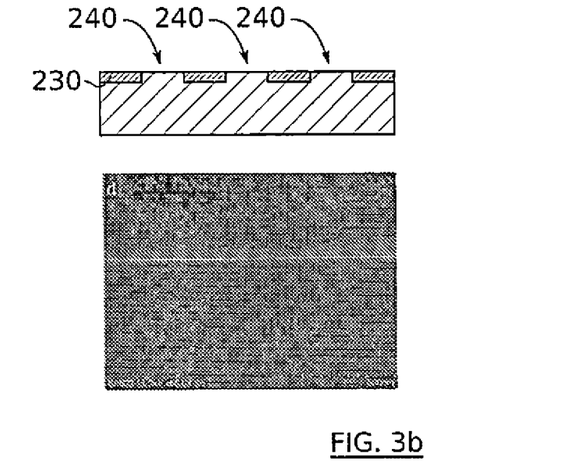

Thus, FIG. 3a shows a plurality of protective patterns 220 around which portions of modified layer 230 have been produced by implantation with carbon species. In this example, there is no residual resin in the portions not covered by the patterns 220, as can be typically the case by the use of a lithography technique to carry out the shaping of the resin from which the patterns 220 are made. The removal of the patterns 220 produces the result in FIG. 3b.

Figure 3C:
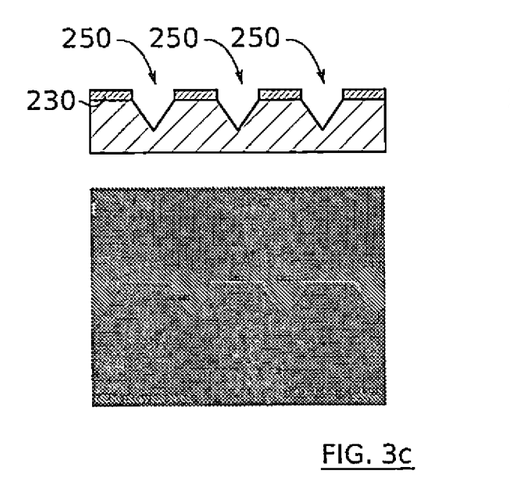
Figure 3D:
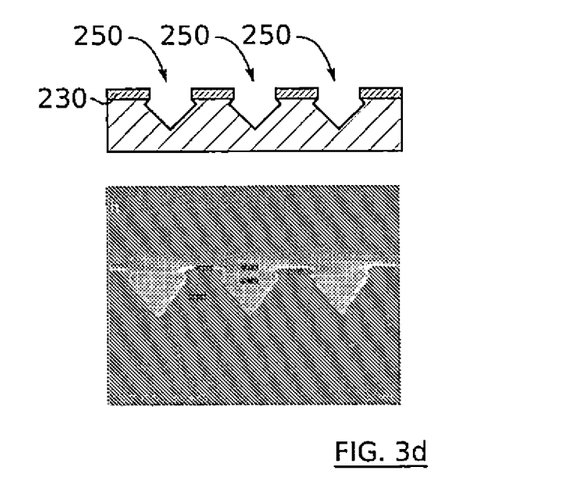

As above, etching is carried out in FIG. 3c, generating inclined sides in a plurality of etched zones 250 each corresponding to a portion of the first zone 240 not protected by the modified layer 230. The continuation of the etching produces an etched region underlying the modified layer 230, thus forming notching 253 (see FIG. 3d) shown in more detail in the embodiment of FIG. 5b. Although not shown, it is possible to continue the etching in such a way that it extends laterally (that is to say, perpendicularly to the thickness dimension of the substrate 100) in order to further reduce the zone of the modified layer 230 in contact with the underlying material of the substrate 100. It is possible to continue the etching until this reduction completely destroys the support of the modified layer 230 which is thus no longer supported by the substrate 100 strictly speaking. This configuration can allow the modified layer 230 to be removed during the etching, without a specific step, as indicated above.

Figure 4:
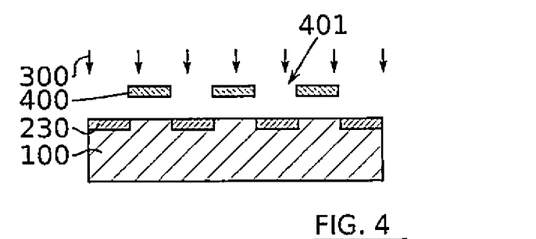
FIG. 4 sketches an alternative for the definition of the carbon modified layer with respect to the examples in FIGS. 2a to 2f and 3a to 3d.

FIG. 4 provides another embodiment in which the protective screen, allowing the carbon implantation to be limited beyond the predefined threshold in the second zone 221, is made with a mask 400 placed above the face 101 of the substrate 100 and comprising one or more openings 401 corresponding to the definition of the second zone 221. This mask 400 can be placed at a distance from the face 101, that is to say, at a distance from the stack comprising the substrate 100. Preferably, this mask 400 can be reused from one substrate 100 to another.

Typically, the mask 400 forming a protective screen is comprised in a piece of implantation equipment with which the implantation 300 of carbon species is carried out. The substrate 100 is introduced into the piece of equipment by being placed facing the mask 400 forming a protective screen. At the end of implantation 300 and before the step of etching the substrate 100, the latter is moved out of the piece of implantation equipment, this step thus corresponds to a removal of the mask 400 forming a protective screen with respect to the substrate 100.

It is understood that the implantation 300 only affects the desired zones of the substrate 100. In this configuration, the implantation 300 involves carbon ions and/or ions of carbon compounds. The implantation parameters can be of the type presented for the embodiments above. The mask 400 is for example made of aluminium.

Figure 5A:
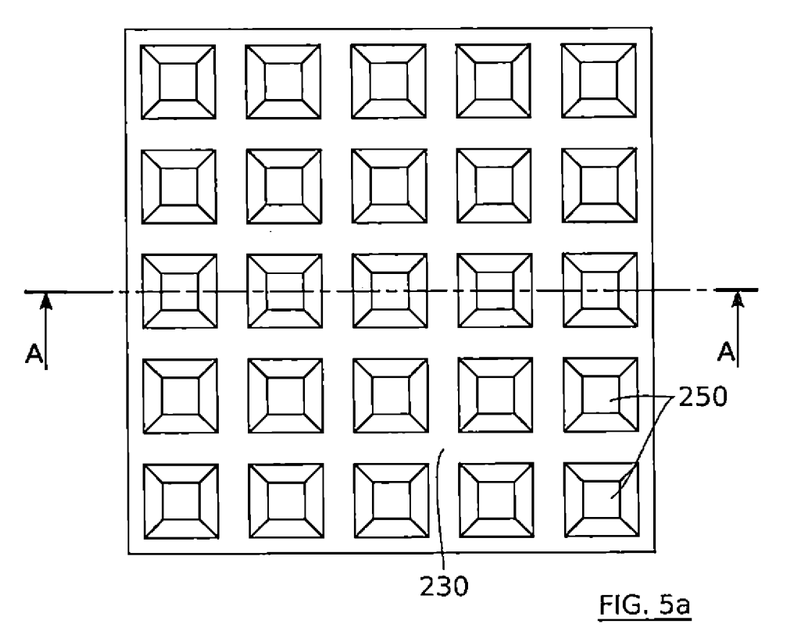
FIG. 5a is a top view of an example of forming a plurality of periodic reliefs on the surface of a substrate.

In terms of uses, the invention allows, for example, for manufacturing reliefs in the shape of a truncated inverted pyramid, intended for example for the manufacturing of MEMS, to be manufactured. It is this example that is revealed by FIG. 5a, which is a top view of a plate, in particular of silicon, forming a substrate 100. The etched zones 250 result from etching after definition of the patterns to be etched by a modified layer 230. In the example, this modified layer forms a grid allowing a continuous contour to be formed around each etched zone 250 but this is not necessarily the case for the manufacturing of MEMS.

Figure 5B:
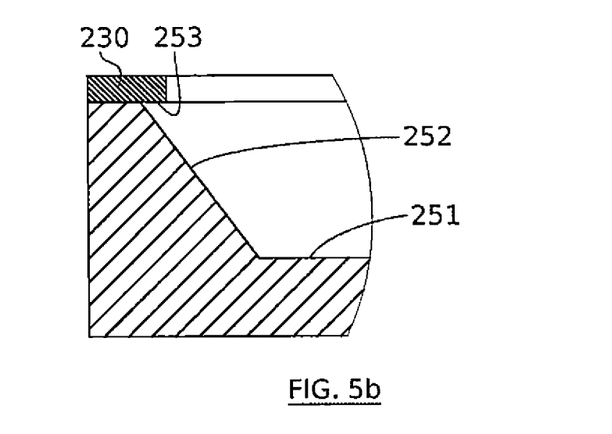
FIG. 5b shows a partial cross-sectional view thereof along the line AA with an example of the profile of the reliefs formed.

The profile of the etched zones 250 is visible in a partial cross-section in FIG. 5b in which it should be noted that the pyramid is truncated, namely that is comprises a bottom 251, preferably having a square cross-section, and a lateral wall 252 forming a slope flaring outwards from the bottom 251 towards the face 101 of the substrate 100. As indicated above, the kinetics of the etching, which is wet, can be configured to attack a zone 253 underlying the modified layer 230.

Figure 6A:
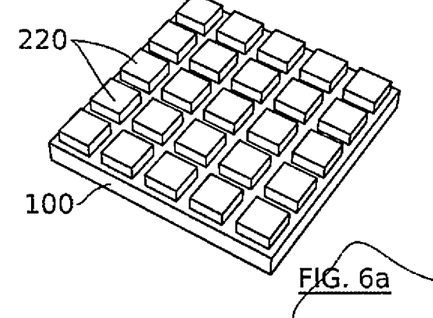
FIGS. 6a to 6e show potential successive steps implemented by the invention in order to obtain hollow reliefs in the shape of an inverted pyramid.
Figure 6B:
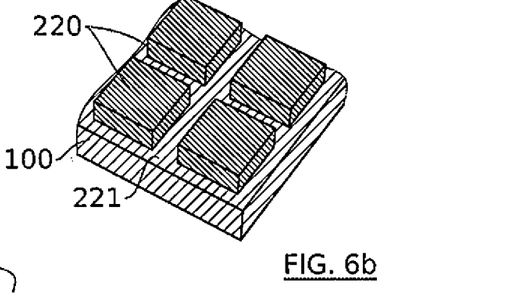
Figure 6C:
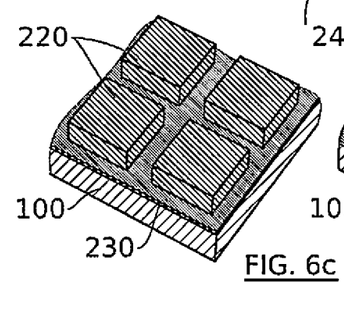
Figures 6D, 6E:
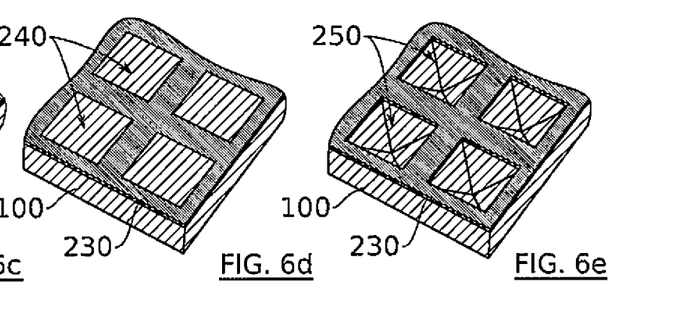

An additional example of formation of this type of pattern is provided in reference to FIGS. 6a to 6e, with reliefs in the shape of a non-truncated inverted pyramid this time that can in particular be intended for manufacturing photovoltaic cells. Thus, in this new example, the etching time is greater than that of the preceding embodiment. In FIG. 6a, the protective patterns 220 have been formed, for example via lithography using a layer of resin 210 as above. In FIG. 6b, it should be noted in more detail that the patterns 220 are separated from each other by a second zone 221 of the face 101 of the substrate 100. It is this zone that undergoes the modification forming the modified layer 230 via the implantation described above (FIG. 6c). This is followed by a removal of the material of the patterns 220 in order to expose the first portion 240 at the face 101 of the substrate 100, this portion not being protected by the etching, contrary to the modified layer 230 (FIG. 6d). Finally, as illustrated in FIG. 6e, the etching is produced as above, advantageously via a wet process, in order to generate sloped patterns having the shape of an inverted pyramid.

Figure 7:
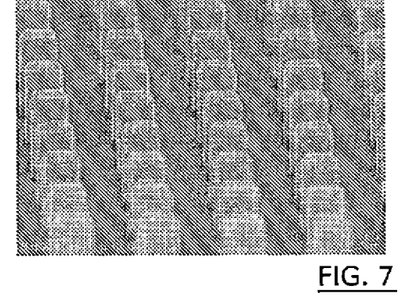
Figure 8:
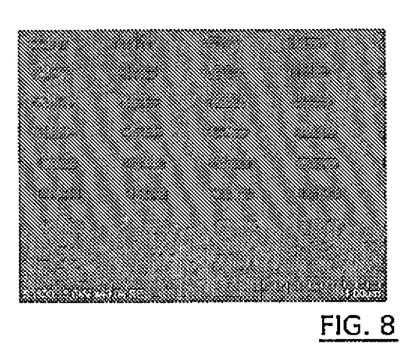
FIG. 8 is a microscope view corresponding to the example of FIG. 6e.

FIG. 7 discloses a photographic image made from an observation, with a microscope, of a situation substantially corresponding to that of FIG. 6a. FIG. 8 corresponds to a photographic image from a microscopic observation of the final result, in a similar manner to FIG. 6e.

Unless specifically indicated otherwise, technical features described in detail for a given embodiment can be combined with technical features described in the context of other embodiments that were described as examples and are not limiting, including those explained in detail above.

Given the above description, it is clear that the invention proposes a reproducible solution having a reduced number of steps for obtaining reliefs in a substrate.

The invention is not limited to the embodiments described above and extends to all the embodiments covered by the claims.

REFERENCES

100. Substrate
101. Face
110. Layer of hard mask
120. Layer for defining a pattern
130. Pattern 140. Etched relief
210. Layer for defining a pattern
220. Protective pattern
221. Zone
230. Modified layer
240. First zone
250. Etched zone
251. Bottom
252. Lateral wall
253. Notching
300. Implantation
400. Mask
401. Opening

The invention claimed is:

1. A method for forming reliefs on a face of a substrate, successively comprising:
    forming a protective screen for protecting at least a first zone of the face of the substrate, the forming comprising depositing a layer for defining patterns on the face of the substrate, and then forming, using the deposited layer for defining patterns, at least one pattern in the first zone, the deposited layer for defining patterns comprising at least one carbon species;
    an implanting to introduce at least one species comprising carbon into the substrate from the face of the substrate, the forming of the protective screen and the implanting being configured to form, in the substrate, at least one carbon modified layer having a concentration of implanted carbon greater than or equal to an etching threshold only from a second zone of the face of the substrate not protected by the protective screen,
    the implanting comprising using an ion beam to:
        remove, from the layer for defining patterns, at least carbon ions of the at least one carbon species, and
        make carbon ions penetrate into the substrate and from the second zone so as to at least partially form the at least one carbon modified layer;
    removing the protective screen; and
    etching the substrate from the first zone selectively with respect to the second zone,
    wherein the forming of the at least one pattern comprises eliminating only a portion of a thickness of the layer for defining patterns in the second zone, the eliminating comprising a step of nanoimprinting or a step of lithography.

2. The method according to claim 1, wherein the implanting is configured such that the at least one carbon modified layer has a thickness greater than or equal to 5 nm.

3. The method according to claim 1, wherein the implanting is configured such that the at least one carbon modified layer contains a concentration of implanted carbon of at least $10^{17}$ atoms of carbon per $cm^3$.

4. The method according to claim 1, wherein the implanting is configured such that the at least one carbon modified layer contains a concentration of implanted carbon of at least $10^{18}$ atoms of carbon per $cm^3$.

5. The method according to claim 1, wherein the forming of the protective screen and the implanting are configured to not produce any implantation in the first zone.

6. The method according to claim 1, further comprising removing the at least one carbon modified layer after the etching.

7. The method according to claim 6, wherein the removing the at least one carbon modified layer after the etching comprises a plasma etching.

8. The method according to claim 1, wherein the etching comprises at least one step of wet etching.

9. The method according to claim 8, wherein the step of wet etching is configured to etch a region of the substrate located under the at least one carbon modified layer.

10. The method according to claim 9, wherein the region of the substrate is located under and in contact with an entirety of the at least one carbon modified layer.

11. The method according to claim 1, wherein at least one portion of the second zone forms a closed contour around at least one portion of the first zone.

12. The method according to claim 1, wherein the layer for defining patterns comprises at least one undercoat and at least one upper layer above the undercoat.

13. The method according to claim 12, wherein the forming of the at least one pattern in the first zone, by using the layer for defining patterns, comprises removing the at least one upper layer vertically in line with the second zone while preserving the undercoat vertically in line with the second zone.

14. The method according to claim 12, wherein the at least one upper layer is a layer of resin.

15. The method according to claim 12, wherein the undercoat is an antireflective layer.

16. The method according to claim 1, wherein the ion beam is a beam of non-carbon ions.

17. The method according to claim 1, wherein the ion beam is a beam of heavy ions.

18. The method according to claim 1, wherein the substrate is formed from or contains one of monocrystalline silicon, multicrystalline silicon, and amorphous silicon.

* * * * *